United States Patent [19]
Ohnishi et al.

[11] Patent Number: 5,566,191
[45] Date of Patent: Oct. 15, 1996

[54] SOFT DECISION MAXIMUM LIKELIHOOD DECODING METHOD WITH ADAPTIVE METRIC

[75] Inventors: Makoto Ohnishi; Yasuko Shinata, both of Tokyo; Yoshiaki Asakawa, Kawasaki; Masahiro Koya, Kodaira, all of Japan

[73] Assignees: Hitachi, Ltd.; Hitachi Denshi Kabushiki Kaisha, both of Tokyo, Japan

[21] Appl. No.: 57,813

[22] Filed: May 7, 1993

[30] Foreign Application Priority Data

May 12, 1992 [JP] Japan ................................ 4-119241

[51] Int. Cl.⁶ ............................. H04L 1/20; H03M 13/12
[52] U.S. Cl. ............................................. 371/43; 375/262
[58] Field of Search .................................. 371/43, 44, 45, 371/46, 37.4; 375/15, 7, 101, 262

[56] References Cited

U.S. PATENT DOCUMENTS

| | | | |
|---|---|---|---|
| 4,763,331 | 8/1988 | Matsumoto | 371/43 |
| 4,829,543 | 5/1989 | Borth et al. | 375/83 |
| 4,852,090 | 7/1989 | Borth | 375/15 |
| 5,142,551 | 8/1992 | Borth et al. | 375/7 |
| 5,271,042 | 12/1993 | Borth et al. | 375/101 |

OTHER PUBLICATIONS

Matsumoto, Tadashi. "Soft Decision Decoding of Block Codes Using Received Signal Envelope in Digital Mobile Radio," Jan. 1989.

IEEE Journal on Selected Areas in Communications, vol. 7, No. 1, pp. 107–113.
Ungerboeck, G., "Adaptive Maximum–Likelihood Receiver for Carrier–Modulated Data–Transmission Systems", IEEE Trans. on Comm., vol. COM–22, No. 5, May 1974, pp. 624–636.
Subasinghe–Dias et al., "Coded 16 QAM With Channel State Derived Decoding for Fast Fading Land Mobile Channels", *International Conf. on Communications*, Jun. 23–26, 1991.

*Primary Examiner*—Stephen M. Baker
*Attorney, Agent, or Firm*—Antonelli, Terry, Stout & Kraus

[57] ABSTRACT

There is provided a maximum likelihood decoding method, and an apparatus, capable of correcting burst errors caused by abrupt lowering of the signal amplitude. The soft decision maximum likelihood decoding method is a maximum likelihood decoding method for conducting maximum likelihood decoding on a received train resulting from addition of an error train to a transmission code train, which has been obtained by coding an information train by using convolutional codes on a transmission side. The soft decision maximum likelihood decoding method includes the step of making corrections by multiplying the soft decision likelihood metric having a multi-valued level, which has been obtained by soft decision likelihood metric from the received train, by weighting coefficients depending upon an instantaneous amplitude of the received signal, and the step of conducting maximum likelihood decoding by using corrected soft decision likelihood metric values. Thereby, it becomes possible to enhance the error correcting capability of error correcting apparatuses used in mobile radio communication or the like with severe fading. As a result, communication reliability is increased.

4 Claims, 5 Drawing Sheets

SOFT DECISION MAXIMUM LIKELIHOOD DECODING METHOD WITH ADAPTIVE METRIC

BACKGROUND OF THE INVENTION

1. Field of the Invention

The present invention relates to a soft decision maximum likelihood decoding method, and apparatus, and in particular to a soft decision maximum likelihood decoding method, and apparatus, which is applied to a mobile radio telecommunication system having a signal level varied by fading.

2. Description of the Related Art

In recent years, error correcting techniques for correcting errors caused in transmission data during transmission have been widely used in many fields in order to improve the reliability of data transmission. Especially, a scheme of coding data by using convolutional codes and performing maximum likelihood decoding by using Viterbi decoding has a high error correcting capability, and the scheme is applied to various fields.

As a known example concerning a Viterbi decoder which is famous as a maximum likelihood decoder, there is a decoder described in JP-A-62-243431 entitled "maximum likelihood decoder". In preparation for description of the present invention, the principle of Viterbi decoding will now be described by taking convolutional codes with a coding rate of ½ and a constraint length of K=3 as an example.

The generator polynomials for convolutional codes with the coding rate of ½ and the constraint length of K=3 is represented by the following expressions (1).

$$\left.\begin{aligned} g_0 &= (1 + D^2)x \\ g_1 &= (1 + D + D^2)x \end{aligned}\right\} \quad (1)$$

In the expressions (1), D represents a delay operator of one unit time and addition is performed by using an exclusive OR. The convolutional coder of the expression (1) is configured as shown in FIG. 1. In FIG. 1, numerals 1 and 2 denote delay elements, which form a 2-bit shift register. Numerals 3, 4 and 5 denote exclusive OR gates. By two bits n and m stored in the shift register, the operation state of the coder is represented. Each time an information bit x is inputted to the shift register, a transition is made in the state of the coder and two bits ($g_0$, $g_1$) are sent out as a transmission code.

An error train is added to this on a transmission channel, and a received train is thus obtained. In a decoder, the state transition of the coder is estimated from this received train, a state transition having maximum likelihood is selected, and an information train is estimated therefrom.

When input information of k bits is coded into n bits, the coding rate R is represented by R=k/n. Assuming that the number of stages of the delay elements is m, the constraint length K is represented by K=(m+1)k.

The principle of operation of the Viterbi decoder will now be described in more detail by referring to FIG. 2. FIG. 2B is a diagram called a trellis diagram, which represents the allowed state transitions over plural time units. Transitions between time $t_m$ and time $t_{m+1}$ are represented as shown in FIG. 2A. In FIG. 2A, x/$g_0$,$g_1$ indicated on a transition branch represents an information bit x and values of outputted codes $g_0$ and $g_1$ at the time when the coder has made its transition. If an information bit 0 is inputted in a state 10, for example, a code 11 is outputted and a transition to state 00 is made.

It is now assumed that 1, 0, 0, 1, 1, 1, 0, 1, (0, 0) are successively inputted to the shift register as an information bit train x. Initial values of the shift register are set to (0, 0). Stopping bits (0, 0) for clearing the shift register are added to the end of the information bit train. Deriving the transmission code train by referring to FIG. 1, we get 11, 01, 11, 11, 10, . . . . Paths for the state transitions are represented by thick solid lines in FIG. 2B. On the receiving side, a received train 11, 01, 01, 11, 11, . . . resulting from addition of an error train 00, 00, 10, 00, 01, . . . caused in the transmission train to the transmission train is received. In the decoder, all state transitions which can be assumed by the coder are traced by referring to the received train and the state transition of the coder is estimated.

In order to quantitatively represent certainty of a state transition, a "likelihood metric" will now be defined. That is to say, the Hamming distance between the received code ($r_0$, $r_1$) and a candidate code is defined as a likelihood metric of the branch. When the received code is 01, for example, the (branch) likelihood metric of each candidate code is given as shown in Table 1.

TABLE 1

| CANDIDATE CODE | 00 | 01 | 10 | 11 |
|---|---|---|---|---|
| BRANCH LIKELIHOOD METRIC | 1 | 0 | 2 | 1 |

The result obtained by successively adding branch likelihood metric values of state transitions up to each state is referred to as "state likelihood metric". In the example shown in FIG. 2, a transition is made from the initial state 00 at time 0 to the state 00 or state 01. Since the output code of the transition from the state 00 to the state 00 is 00 whereas the received code at this time is 11, the branch likelihood metric thereof is 2. In the same way, since the output code of the transition from the state 00 to the state 01 is 11 whereas the received code at this time is 11, the branch likelihood metric thereof is 0. As a result, state likelihood metric values of the state 00 and state 01 at time point 1 are 2 and 0, respectively. In FIG. 2B, a numeral representing the state likelihood metric at each time point is indicated next to the circle indicating the state. On the basis of branch likelihood metric values accompanying possible state transitions from the time point 1 to time point 2, values 3, 3, 0 and 2 are derived as state likelihood metric values of states 00, 01, 10 and 11 at the time point 2, respectively. Furthermore, branch likelihood metric values of possible state transitions from the time point 2 to the time point 3 are derived. On and after this time point, there are two branches leading to each state. In the maximum likelihood decoding process, a branch on a path having a smaller likelihood metric (i.e. a more likely branch) is selected and the other branch is discarded. In FIG. 2B, selected branches are represented by solid lines whereas discarded branches are represented by broken lines. Branch likelihood metric values of selected branches are added as state likelihood metric values. To the state 00 at time point 5, for example, a transition is made from the state 00 or the state 10 at time point 4. The sum of the state likelihood metric and branch likelihood metric become 5 and 2, respectively. A transition from the state 10 having a smaller likelihood metric value is selected. The state likelihood metric of the state 00 at the time point 5 becomes 2. In this way, a coding train concerning a series of branches finally selected (i.e., a surviving path) is a coding train estimated to have a maximum likelihood by the Viterbi decoder.

In FIGS. 2A and 2B, an example having a very high error rate is shown. Among 20 bits, seven bits are erroneous (i.e., error rate is 0.35). In such a state having a high error rate, it is difficult to reduce decoding errors even with maximum likelihood decoding. Writing the received code train in time series by tracing states each having a minimum state likelihood metric value at time point 10 in the example of FIG. 2B, we get 11, 01, 10, 11, 00, 00, 11, 10, 01 and 10. It is understood that as many as eight erroneous bits have been caused from the transmission code train. Such a situation hardly occurs, but it can be sufficiently supposed that such a situation would occur locally in burst errors and some measure is needed.

For the subsequent description, the configuration of the Viterbi decoder is shown in FIG. 3. In FIG. 3, numeral 31 denotes a branch likelihood metric calculation circuit, 32 an addition comparison selection circuit, 33 a state likelihood metric memory, 34 a path memory, and 35 a maximum likelihood decision circuit. According to the method shown in Table 1, the branch likelihood metric calculation circuit 31 derives certainty of state transition (branch likelihood metric) from the received signal. The addition comparison selection circuit 32 derives a new state likelihood metric by adding the branch likelihood metric value of a possible state transition to the state likelihood metric value at the immediately preceding time point stored in the state likelihood metric memory 33. The addition comparison selection circuit 32 compares state likelihood metric values of a plurality of state transitions leading to one state, and selects a transition having a minimum value out of them. Then the addition comparison selection circuit 32 updates contents of the state likelihood metric memory 33 by adopting the state likelihood metric of the selected transition as a new state likelihood metric. At the same time, the addition comparison selection circuit 32 sends information j(i) of the selected transition to the path memory 34, where j(i) represents a transition from state j to state i. The path memory 34 stores this transition information j(i) or state numbers of the transition in a series. The maximum likelihood circuit 35 derives a result of decoding from the state transition selected and left at the final time point.

In the above described maximum likelihood decoding scheme, a method called hard decision is used for calculation of branch likelihood metric. In the hard decision, the reliability of the transmission code train is measured with a Hamming distance of the code train as defined in Table 1. On the other hand, there is a soft decision scheme in which the reliability of the transmission code is given by the Euclidean distance of the amplitude value of the received signal. This is shown in FIG. 4.

FIG. 4 gives a soft decision likelihood metric for a one-dimensional (one bit) code. In case of two-dimensional (two-bit) code, it may be applied to each bit and results may be added together. The received signal level +V corresponds to code "0", and −V corresponds to code "1". In FIG. 4, a likelihood metric for code "0" is represented. As this likelihood metric, values 0 to 16 are assigned according to the received amplitude value. That is to say, if a signal having an amplitude as represented by an illustrated received signal amplitude value A is received, the likelihood metric at the time of the hard decision becomes 0. In the hard decision, it is known that the received code is near the code "0", but its certainty cannot be judged with sufficient precision. On the other hand, 6 is given as the likelihood metric in soft decision. Since this is a value close to 8 (middle point between two code levels), it can be judged to be close to the code "0" but is low in reliability. The likelihood metric for the code "1" has a slope symmetrical to the likelihood metric for the code "0" with respect to the vertical axis of FIG. 4.

It is known that introduction of the soft decision likelihood metric as shown in FIG. 4 further improves the performance of the maximum likelihood decoding scheme. However, improvement of performance due to soft decision is limited to transmission channel on which the received signal level is nearly constant and random errors are caused. On a transmission channel having a received signal level abruptly changed by fading as in mobile radio communication systems, concentrated errors occur in a burst when the received signal level has dropped. This is equivalent to a very high rise in local error rate. In such a case, the Viterbi decoder loses its error correcting capability.

This situation will now be described by referring to a trellis diagram of a Viterbi decoder using a soft decision likelihood metric as shown in FIG. 5. In FIG. 5, a soft decision likelihood metric has been applied to the example of FIG. 2. That is to say, a transmission code "0" is associated with a received level +7 whereas transmission code "1" is associated with a received level −8. Therefore, a transmission code (0, 1) corresponds to a received level (7, −8). Values of error trains are also represented by levels. Levels of −8 or less and +8 or more are judged to be erroneous. For example, therefore, an error pattern (9, −5) corresponds to an error pattern (1, 0) of FIG. 2. The actual received level is the sum of the signal level value of a transmission code and the error value. With respect to a received code, the soft decision branch likelihood metric of each transmission code is given by the sum of signal level differences of respective columns between those codes. For example, when the received level is (1, 2), the branch likelihood metric is given as shown in Table 2.

TABLE 2

| CODE (BINARY NUMBER) | 00 | 01 | 10 | 11 |
|---|---|---|---|---|
|  | (7, 7) | (7, −8) | (−8, 7) | (−8, −8) |
| BRANCH LIKELIHOOD METRIC (DECIMAL) | 11 | 16 | 14 | 19 |

The result obtained by conducting maximum likelihood decoding processing in the same way as FIG. 2 by using the soft decision branch likelihood metric is shown in FIG. 5. Selected branches are represented by solid lines, whereas discarded branches are represented by broken lines. A numeral indicated next to a circle representing a state indicates the value of the state likelihood metric at each time point. Furthermore, state transitions corresponding to the transmission code train are represented by thick solid lines. As understood from FIG. 5, a transition corresponding to the transmission code train is not selected and is broken between time points 7 and 8. That is to say, it is understood that error correction is difficult even if the soft decision scheme is used, in the case that errors locally concentrate and the error rate becomes momentarily high as shown in FIG. 5.

SUMMARY OF THE INVENTION

An object of the present invention is to improve the calculation method of a soft decision likelihood metric of conventional Viterbi decoders and provide a soft decision maximum likelihood decoding method, and apparatus, which can be applied to transmission channels in which the signal level varies and errors occur in a burst. The soft decision maximum likelihood decoding method according to the present invention is a soft decision maximum likelihood decoding method for providing each received code with a likelihood metric of a candidate code thereof in the form of a soft decision likelihood metric represented by a multi-valued level when conducting maximum likelihood decoding on a received code train on a receiving side, the received code train corresponding to a transmission code train obtained by coding an information train by using convolutional codes on a transmission side. The soft decision maximum likelihood decoding method according to the present invention includes the step of making corrections by multiplying the soft decision likelihood metric values by weighting coefficients depending upon an instantaneous amplitude of the received signal, and the step of conducting maximum likelihood decoding by using corrected soft decision likelihood metric values.

A relationship between the above described weighting coefficient and the instantaneous received amplitude is represented by, for example, a monotonically increasing function of a normalized amplitude A ($0 \leq A \leq 1$) which is normalized by the maximum received amplitude and which opens upwards.

Furthermore, the soft decision maximum likelihood decoding decoder according to the present invention is a soft decision maximum likelihood decoder for providing each received code with likelihood metric of a candidate code thereof in the form of soft decision likelihood metric represented by a multi-valued level when receiving a transmission code train obtained by coding an information train by using convolutional codes on a transmission side and conducting maximum likelihood decoding on a received code train on a receiving side. The soft decision maximum likelihood decoder according to the present invention includes a soft decision branch likelihood metric calculation means for deriving a soft decision branch likelihood metric with respect to each received code, a received amplitude signal generation means for generating a signal depending upon an instantaneous amplitude of a received signal, and a multiplying means for multiplying each soft decision branch likelihood metric, which has been derived by the soft decision branch likelihood metric calculation means, by the corresponding received amplitude signal as a weighting coefficient.

In the Viterbi decoder, branch likelihood metric values at respective time points are added up to derive the state likelihood metric and state transitions are selected depending upon whether the state likelihood metric is large or small. When the signal amplitude is large, the likelihood metric difference between transmission codes is also large and hence the state likelihood metric difference is also large, resulting in high probability of proper execution of maximum likelihood decoding. When the signal amplitude is small, however, there are many errors and certainty of received signals is reduced. Nevertheless, the conventional maximum likelihood scheme gives the same certainty as that given when the signal amplitude is large. In a situation where the branch likelihood metric is added to the state likelihood metric, when the signal amplitude is small and the uncertainty becomes low, the weighting coefficient is reduced smaller than that used when the amplitude is large. This introduces a situation where the errors are not easily reflected to the state likelihood metric. The present inventors have conceived such an idea. The likelihood metric calculation method according to the present invention has an effect that the degree of certainty of state likelihood metric values added when the certainty is high is not destroyed by the branch likelihood metric obtained when the certainty is low. This functions to raise the probability that maximum likelihood decoding can be conducted even when the frequency of errors is high.

Owing to the present invention, it is thus possible to lighten the difficulty caused when the soft decision maximum likelihood decoder is applied to a system, such as a mobile radio communication line, having a received signal level varied abruptly by fading. That is to say, even if an average error rate on such a line is low, errors occur in a burst so as to concentrate on one time point when the signal level has become low, resulting in a high instantaneous error rate. This causes the problem of the conventional technique that the decoding operation of the maximum likelihood decoder fails and the error correcting capability is lost. Against the problem, a weighting coefficient depending upon the received signal amplitude is introduced into calculation of the soft decision likelihood metric to make a discrimination between the likelihood metric at the time when the signal amplitude is large and the likelihood metric at the time when the signal amplitude is small. By thus adding the branch likelihood metric, which is obtained when the amplitude is small and the error rate is high, to the state likelihood metric, it is possible to lighten reduction of precision of the state likelihood metric and suppress lowering of error correcting capability. Therefore, the present invention can be applied to not only mobile radio communication but also communication systems having signal levels varied. In implementing the present invention, the circuit part increased from the conventional maximum likelihood decoder is little. Since the decoder according to the present invention can be constructed by only modifying an AGC circuit included in the conventional demodulator, it can be easily implemented. Furthermore, since the entire circuit can be formed by using a digital circuit, its LSI implementation is possible.

The foregoing and other objects, advantages, manner of operation and novel features of the present invention will be understood from the following detailed description when read in connection with the accompanying drawings.

DESCRIPTION OF THE PREFERRED EMBODIMENTS

Figure 6:
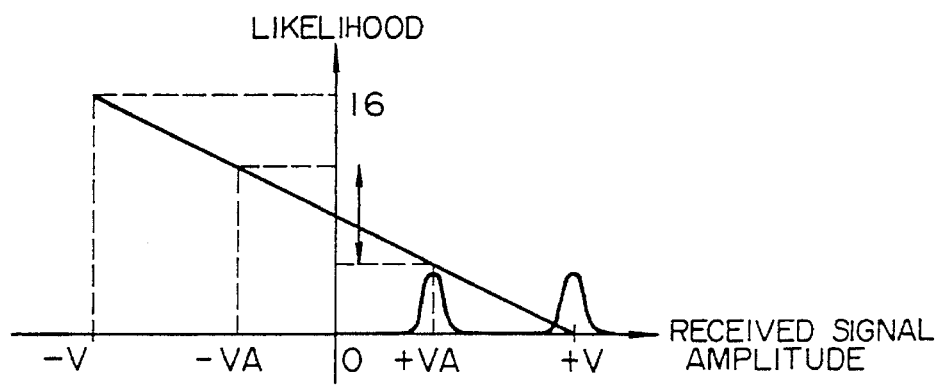
FIG. 6 is a diagram for describing the principle of a soft decision scheme according to the present invention.

In the present invention, branch likelihood metric with due regard to the received signal level is introduced. As shown in FIG. 6, discrimination values are set at +V and −V with respect to the received signal amplitude. The middle point 0 between both decision values becomes a discrimination threshold. Even if the received signal amplitude does not reach +V and −V, code discrimination is possible. Typically, however, AGC (automatic gain control) is used to make the received level equivalent to +V and −V.

On such a line that the received amplitude varies severely because of fading, however, the instantaneous received amplitude varies and becomes +VA, for example, which is considerably lower than +V as shown in FIG. 6. At this time, noise on the line is constant irrespective of the received level and exhibits noise distribution as shown in FIG. 6. That is to say, C/N (ratio of signal power to noise power) becomes lower at the received signal amplitude +VA. The likelihood metric in maximum likelihood decoding varies according to C/N. When the received signal level lowers and C/N becomes lower, therefore, the likelihood metric must also be reduced. As represented by "likelihood metric with due regard to signal amplitude" in FIG. 6, therefore, the product of the maximum likelihood 16 and the square of normalized signal amplitude $(A/Amax)^2$ is used as corrected likelihood metric.

Figure 7:
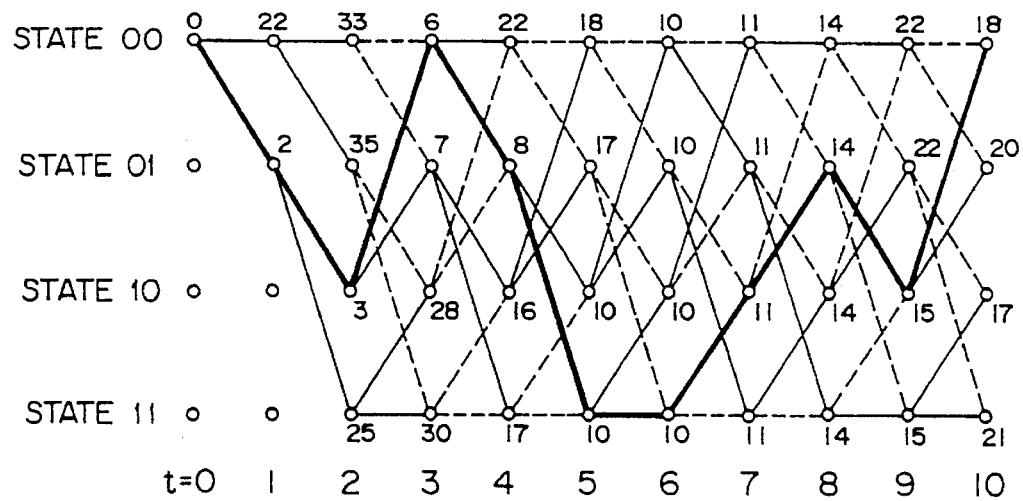
FIG. 7 is a trellis diagram of the soft decision scheme according to the present invention.

FIG. 7 shows a trellis diagram of the case where the above described soft decision branch likelihood metric with due regard to signal amplitude is employed. In FIG. 7, an item of received signal level has been added to the example used in FIG. 5. When the received signal level is low, many errors occur. By considering the received signal amplitude, the dispersion of the soft decision likelihood metric becomes small. This effect becomes smaller as the received level becomes lower. Between time points 4 and 5, for example, the received amplitude is 0.3 and the signal level of the received code is (1, 2). Therefore, the product (see Table 3) of likelihood metric for each code shown in Table 2 and $(0.3)^2=0.09$ is newly adopted as branch likelihood metric between time points 4 and 5.

TABLE 3

| CANDIDATE CODE (BINARY NUMBER) | 00 (7, 7) | 01 (7, −8) | 10 (−8, 7) | 11 (−8, −8) |
|---|---|---|---|---|
| BRANCH LIKELIHOOD METRIC (DECIMAL) | 11 | 16 | 14 | 19 |
| BRANCH LIKELIHOOD METRIC WITH DUE REGARD TO AMPLITUDE | 1 | 1 | 1 | 2 |

Figure 5:
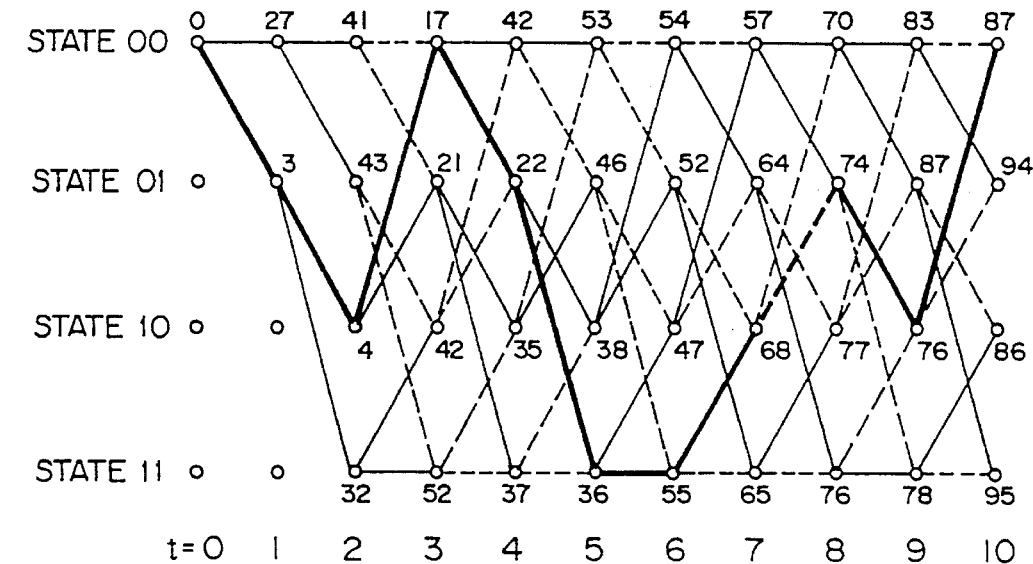
FIG. 5 is a trellis diagram of a conventional soft decision scheme.

A trellis diagram obtained by conducting maximum likelihood decoding processing in the same way as FIG. 5 by using the above described soft decision branch likelihood metric is shown in FIG. 7. As understood from FIG. 7, transitions for the transmission train also survive until time point 10 without being discarded on the way. Even on such a line that the signal amplitude abruptly changes and errors occur to concentrate in a place where the amplitude is small, it is thus possible to improve the error rate of maximum likelihood decoding by using the soft decision likelihood metric according to the present invention.

As heretofore described, the value of branch likelihood metric changes according to the signal amplitude in the soft decision maximum likelihood decoding scheme. As an example of time when the signal amplitude is large, the received amplitude is 0.8 and the signal level of the received code is (−5, −6) between time points 3 and 4 in FIG. 7. Therefore, the branch likelihood metric at this time can be represented by the following Table 4.

TABLE 4

| CANDIDATE CODE (BINARY NUMBER) | 00 (7, 7) | 01 (7, −8) | 10 (−8, 7) | 11 (−8, −8) |
|---|---|---|---|---|
| BRANCH LIKELIHOOD METRIC (DECIMAL) | 25 | 14 | 16 | 5 |
| BRANCH LIKELIHOOD METRIC WITH DUE REGARD TO AMPLITUDE | 16 | 9 | 10 | 3 |

The difference between the maximum value and the minimum value of branch likelihood metric between transmission codes is 20 in case the amplitude is not considered, whereas it is 13 in case the amplitude is considered. On the other hand, they respectively become 8 and 1 in case of Table 3 (with amplitude of 0.3), i.e., when the amplitude is small. That is to say, the soft decision likelihood metric ratio is 8/20 (small amplitude/large amplitude) in case the amplitude is not considered. Meanwhile, the likelihood metric difference is compressed to 1/13 (small amplitude/large amplitude) in case the signal amplitude is considered.

Figure 1:
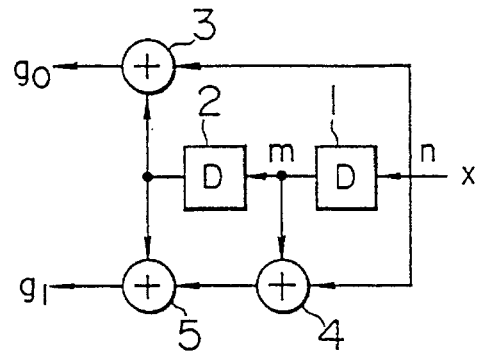
FIG. 1 is a configuration diagram of a conventional convolutional coder.
Figure 3:
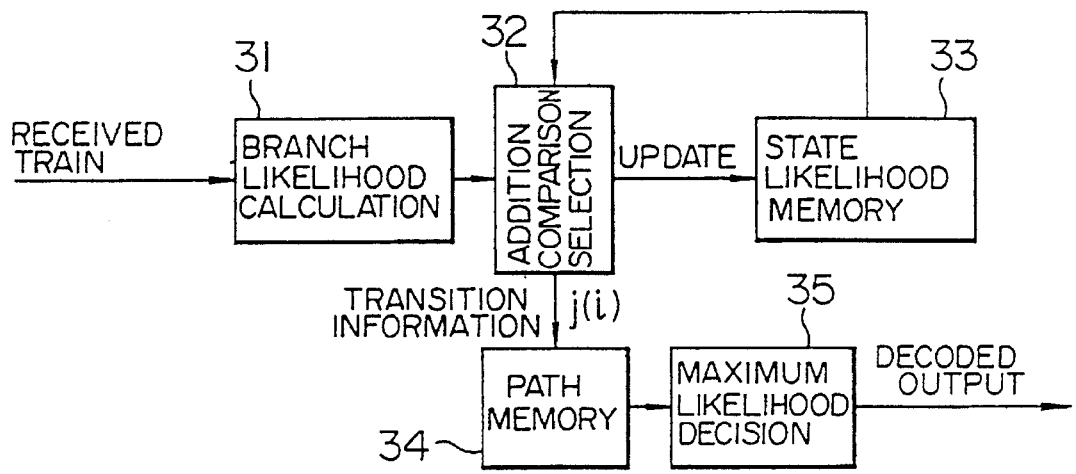
FIG. 3 is a block diagram showing the configuration of a conventional Viterbi decoder.
Figure 4:
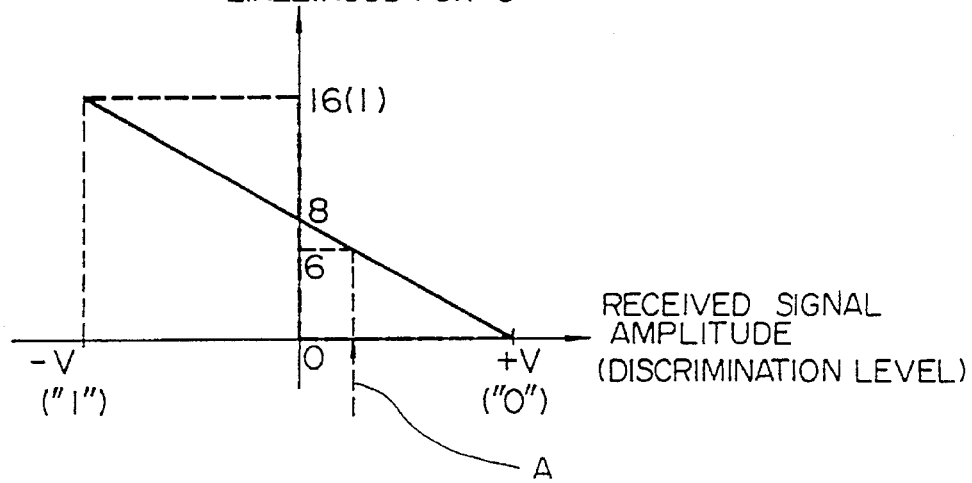
FIG. 4 is a diagram for describing a conventional soft decision scheme.
Figures 2A, 2B:
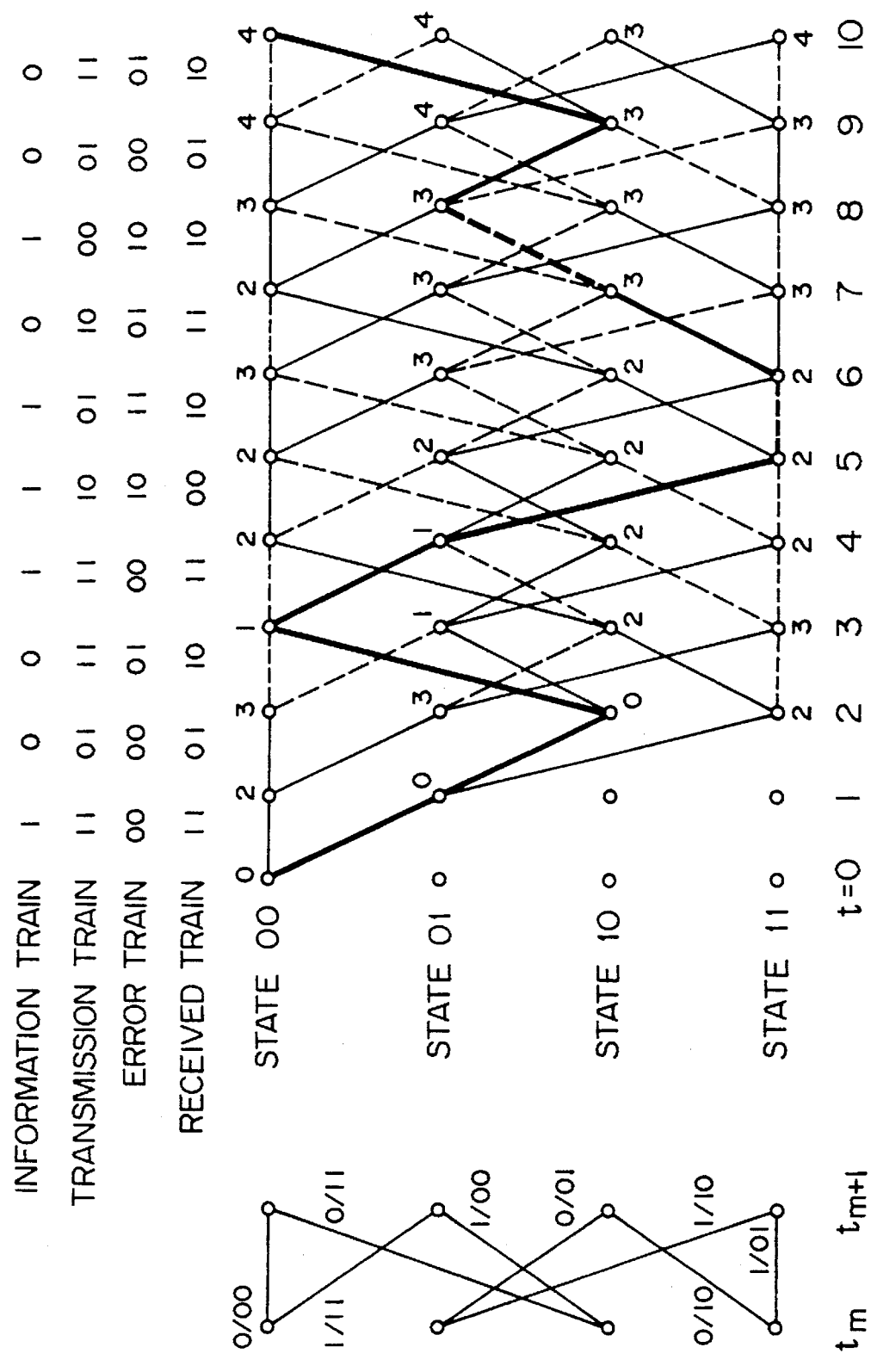
FIGS. 2A and 2B are trellis diagrams representing the operation of the convolutional coder shown in FIG. 1.
Figure 8:
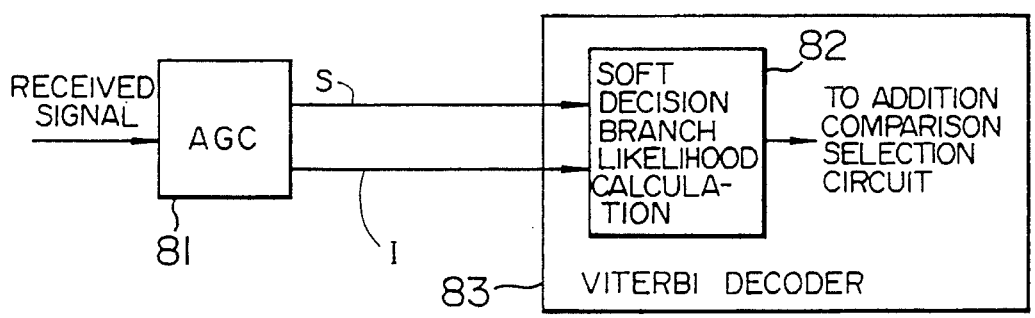
FIG. 8 is a configuration diagram of an embodiment of the present invention.

FIG. 8 shows the configuration of an embodiment of the maximum likelihood decoder using soft decision likelihood metric with due regard to signal amplitude according to the present invention. In FIG. 8, numeral 81 denotes an AGC (Automatic Gain Control) circuit, 82 a soft decision branch likelihood metric calculation circuit, and 83 a Viterbi decoder. The AGC circuit is used as a part of a demodulator circuit to keep the amplitude of the received signal at a constant level. In the AGC, an average amplitude value over a certain time interval is typically used. Herein, however, an instantaneous amplitude value of the received signal is used. At the same time, the received signal itself is also sent to the soft decision branch likelihood metric calculation circuit 82. In the same way as the branch likelihood metric calculation circuit 31 included in the conventional Viterbi decoder shown in FIG. 3, the soft decision branch likelihood metric calculation circuit 82 is a circuit for calculating the likelihood metric of each code train with respect to received trains. The soft decision branch likelihood metric calculation circuit 82 differs from the conventional likelihood metric calculation circuit in that soft decision likelihood metric is calculated and the soft decision likelihood metric is further multiplied by a weighting coefficient depending upon signal amplitude. The soft decision likelihood metric thus derived is sent to an addition comparison selection circuit included in the Viterbi decoder 83. Parts of the Viterbi decoder 83 other than the soft decision branch likelihood metric calculation circuit 82 are similar to the configuration of FIG. 3.

Figure 9:
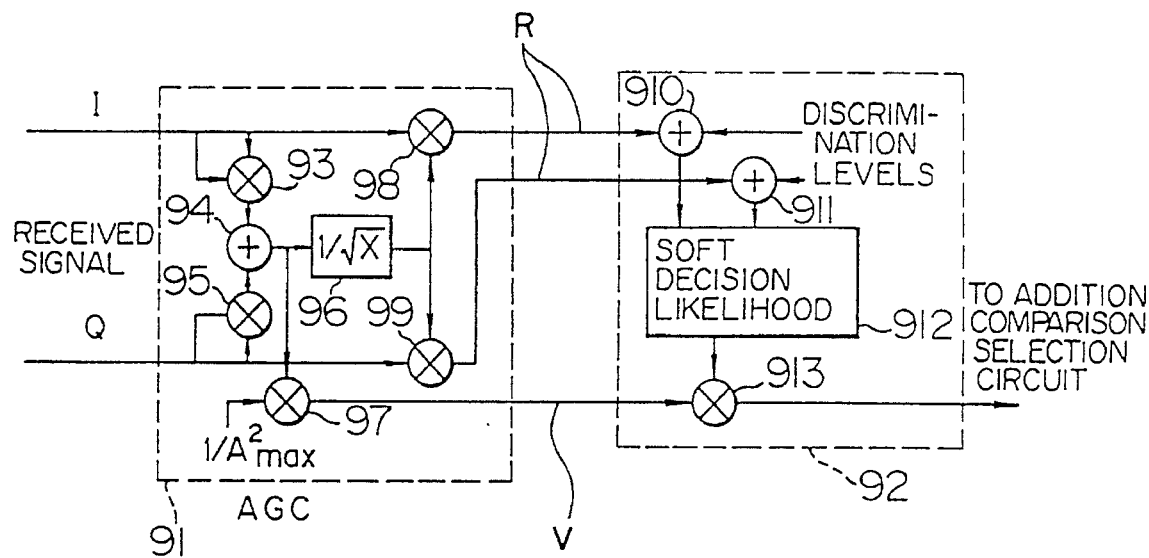
FIG. 9 is a detailed configuration diagram of another embodiment of the present invention.

FIG. 9 shows an example of configuration of the automatic gain control (AGC) circuit 91 and the soft decision branch likelihood metric calculation circuit 92, in which the present invention has been applied to a quadrature modulation scheme such as four-phase phase modulation. The AGC circuit 91 includes multipliers 93, 95, 97, 98 and 99, an adder 94, and a calculator 96 for calculating the reciprocal of square root. The soft decision branch likelihood metric calculation circuit 92 includes a multiplier 913, adders/subtracters 910 and 911, and a soft decision likelihood metric calculator 912. The quadrature modulated wave has an in-phase (I) component and a quadrature (Q) component. Its signal amplitude is represented by the square root of $(I^2+Q^2)$. Square values of I and Q are calculated in the multipliers 93 and 95 included in the automatic gain control circuit 91, respectively. The square values of I and Q are then added together in the adder 94. The square of the signal amplitude is thus obtained. The reciprocal of the signal amplitude is then derived by the square root reciprocal calculator 96. By multiplying the I and Q signal components by the reciprocal of the signal amplitude respectively in the multipliers 98 and 99, the received signal adjusted in amplitude by the instantaneous amplitude is obtained. This is inputted to the soft decision branch likelihood metric calculation circuit 92. In order to derive a weighting coefficient whereby the soft decision likelihood metric is to be multiplied, the square of the instantaneous signal amplitude obtained from the adder 94 is multiplied by the reciprocal of the square of the maximum signal amplitude (1/Amax$^2$) in the multiplier 97. The received signal amplitude square value which has been normalized is thus obtained from the multiplier 97. In the soft decision branch likelihood metric calculation circuit 92, the received signal is compared with the discrimination levels by the adders/subtracters 910 and 911 and the soft decision likelihood metric is calculated by the soft decision likelihood metric calculator 912. The soft decision likelihood metric can be obtained by, for example, writing beforehand relationship between the signal amplitude and likelihood metric and reading this on the basis of comparison value of the signal amplitude with the discrimination levels. A resultant soft decision likelihood metric is multiplied by the normalized received signal amplitude square value in the multiplier 913. The soft decision likelihood metric multiplied by a weighting coefficient can be thus obtained. This is inputted to the addition comparison selection circuit and subjected to maximum likelihood decoding therein.

As a method for weighting the soft decision likelihood metric with signal amplitude, the method of using the square of signal amplitude has heretofore been described. However, other methods may also be used so long as such a weighting coefficient that the likelihood metric difference becomes small for small amplitude is used.

Figure 10:
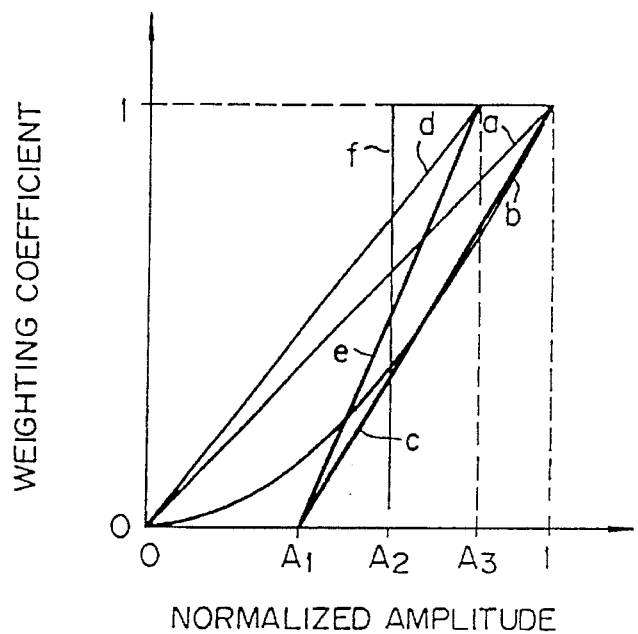
FIG. 10 is a diagram showing an example of a weighting coefficient according to the present invention.

Various weighting coefficients are shown in FIG. 10. As shown in FIG. 10, every weighting coefficient is 0 or more, and 1 or less, i.e., is in a range between 0 and 1. A line a indicates a weighting coefficient proportionate to the normalized amplitude A, and a line b indicates a weighting coefficient proportionate to the square of the normalized amplitude A. In case of a line c, the weighting coefficient is proportionate to the normalized amplitude A-A1 when the normalized amplitude A is larger than A1 and a hard decision is made when the normalized amplitude A is A1 or less. In case of a line d, a soft decision is made as far as a normalized amplitude A is A3 or less and the weighting coefficient is proportionate to the normalized amplitude A when the normalized amplitude A is A3 or less. In case of a line e, the lines c and d are mixedly used. That is, a hard decision is made when the normalized amplitude A is A2 or less, a soft decision is made as far as the normalized amplitude A is A3 or larger, and when the normalized amplitude A is A1 or greater and is A3 or less, the weighting coefficient is proportionate to A-A1. In case of a line f, the soft decision is used as far as the normalized amplitude A is A2 or larger and the hard decision is used when the normalized amplitude A is A2 or less. As for the weighting coefficient, a similar effect can be anticipated so long as such a weighting coefficient that the likelihood metric difference becomes small for small amplitude is used as described above. Depending upon configuration means, a weighting coefficient which is not smooth for the normalized amplitude value A unlike c, d, e and f of FIG. 10 may simplify the configuration and be convenient.

Embodiments in which a weighting coefficient is fixedly given for the normalized amplitude value have heretofore been described. However, the weighting coefficient parameter (such as A1, A2 or A3 in FIG. 10) may be adaptively changed according to the average signal amplitude of the received signal. Furthermore, a weighting coefficient other than the functions shown in FIG. 10 can be used, and various variations are possible.

Owing to the present invention, it is possible to lighten the difficulty caused when the soft decision maximum likelihood decoder is applied to a system, such as a mobile radio communication line, having a received signal level varied abruptly by fading. That is to say, a discrimination is made between the likelihood metric at the time when the signal amplitude is large and the likelihood metric at the time when the signal amplitude is small. By adding the branch likelihood metric obtained when the amplitude is small and the error rate is high to the state likelihood metric, it is possible to lighten the difficulty of reduction of the state likelihood metric and suppress lowering of error correcting capability. Therefore, the present invention can be applied to not only mobile radio communication but also communication systems having signal levels varied.

We claim:

1. In conducting maximum likelihood decoding on a received code train on a receiving side, said received code train corresponding to a transmission code train obtained by coding an information train by using convolutional codes on a transmission side, a soft decision maximum likelihood decoding method for providing each received code with a likelihood metric of a candidate code thereof in the form of a soft decision likelihood metric represented by a multi-valued level, said soft decision maximum likelihood decoding method comprising the steps of:

deriving an instantaneous received amplitude of the received codes every predetermined period;

making a calculation on each instantaneous received amplitude on the basis of a predetermined function and outputting a result of the calculation as a weighting coefficient;

making corrections by multiplying a plurality of soft decision likelihood metric values derived from received codes by said weighting coefficient; and conducting maximum likelihood decoding by using corrected soft decision likelihood metric values derived at said step of making corrections;

wherein the predetermined function defines a relationship between said weighting coefficient and said instantaneous received amplitude that is a monotonically increasing function of an amplitude which has been normalized by a maximum received amplitude and which opens upwards, and that is a quadratic function of an amplitude which has been normalized by a maximum received amplitude.

2. In conducting maximum likelihood decoding on a received code train on a receiving side, said received code train corresponding to a transmission code train obtained by coding an information train by using convolutional codes on a transmission side, a soft decision maximum likelihood decoding method for providing each received code with a likelihood metric of a candidate code thereof in the form of a soft decision likelihood metric represented by a multi-valued level, said soft decision maximum likelihood decoding method comprising the steps of:

deriving an instantaneous received amplitude of the received codes every predetermined period;

making a calculation on each instantaneous received amplitude on the basis of a predetermined function and outputting a result of the calculation as a weighting coefficient;

making corrections by multiplying a plurality of soft decision likelihood metric values derived from received codes by said weighting coefficient;

conducting maximum likelihood decoding by using corrected soft decision likelihood metric values derived at said step of making corrections:

choosing constants A1 and A2 ($0<A1<A2<1$) for an amplitude A ($0 \leq A \leq 1$) which has been normalized by a maximum received amplitude;

making said predetermined function for determining a relationship between said weighting coefficient and said instantaneous received amplitude equal to 0 for $0 \leq A \leq A1$ and 1 for $A2 \leq A \leq 1$; and making said function equivalent to a linear function of A coupling 0 and 1 or a monotonously increasing function of A opening upwards and coupling 0 and 1 for $A1 \leq A \leq A2$; and wherein the predetermined function defines a relationship between said weighting coefficient and said instantaneous received amplitude that is a monotonically increasing function of an amplitude which has been normalized by a maximum received amplitude and which opens upwards.

3. A soft decision maximum likelihood decoding method according to claim 2, wherein said relationship determining function is made equal to 1/M for said normalized amplitude A satisfying $0 \leq A \leq A1$, where M is a maximum soft decision likelihood metric.

4. A soft decision maximum likelihood decoding method according to claim 2, wherein said constants A1 and A2 are changed according to an average amplitude value of a received signal over a certain fixed time.

* * * * *